United States Patent [19]
Christman

[11] Patent Number: 5,058,499
[45] Date of Patent: * Oct. 22, 1991

[54] IMPARTING AN IMAGE ON A SUBSTRATE

[75] Inventor: Vivan A. Christman, Clemmons, N.C.

[73] Assignee: XPRES Corporation, Winston-Salem, N.C.

[*] Notice: The portion of the term of this patent subsequent to Jan. 1, 2008 has been disclaimed.

[21] Appl. No.: 531,205

[22] Filed: May 31, 1990

[51] Int. Cl.$^5$ .............................................. B41M 1/12
[52] U.S. Cl. .................. 101/129; 101/127.1; 101/128.1
[58] Field of Search ............... 101/114, 115, 116, 117, 101/118, 121, 123, 124, 125, 126, 127, 127.1, 128, 128.1, 128.21, 128.4, 129

[56] References Cited

U.S. PATENT DOCUMENTS

| | | | |
|---|---|---|---|
| 1,277,248 | 8/1918 | Newgass | 101/127.1 |
| 2,071,458 | 2/1937 | Ennis | 101/481 |
| 3,463,587 | 8/1969 | Oltra et al. | 101/128.1 |
| 4,091,727 | 5/1978 | Hasegawa et al. | 101/128.21 |
| 4,981,075 | 1/1991 | Christman | 101/128.1 |

Primary Examiner—Edgar S. Burr
Assistant Examiner—Joseph R. Keating
Attorney, Agent, or Firm—Sprung Horn Kramer & Woods

[57] ABSTRACT

A method to impart an image or a substrate comprising
  (a) placing a heat sensitive thermoplastic resin film supported on an ink pervious porous screen on a surface of a self-adhesive frame,
  (b) placing a sheet containing the desired image in a carbon base on the resultant assembly from (a) with the image side in close contact with the resin film surface of the resultant assembly from (a),
  (c) irradiating the resultant assembly formed in (b), the irradiating producing openings in the resin film in corresponding portions of the resin film which are opposed to the image,
  (d) peeling the sheet off of the resultant assembly from (c),
  (e) stretching taut the resultant assembly from (d) by placing the resultant assembly from (d) in a sheet stretching holding frame,
  (f) placing the resultant assembly from (e) onto a screen printer means and
  (g) applying ink on the resultant assembly from (a) containing the openings produced in (c) to force the ink through the openings onto the substrate.

9 Claims, 5 Drawing Sheets

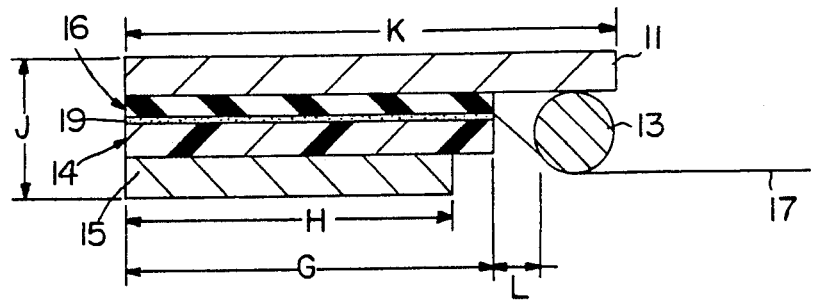
FIG.5
FIG.6
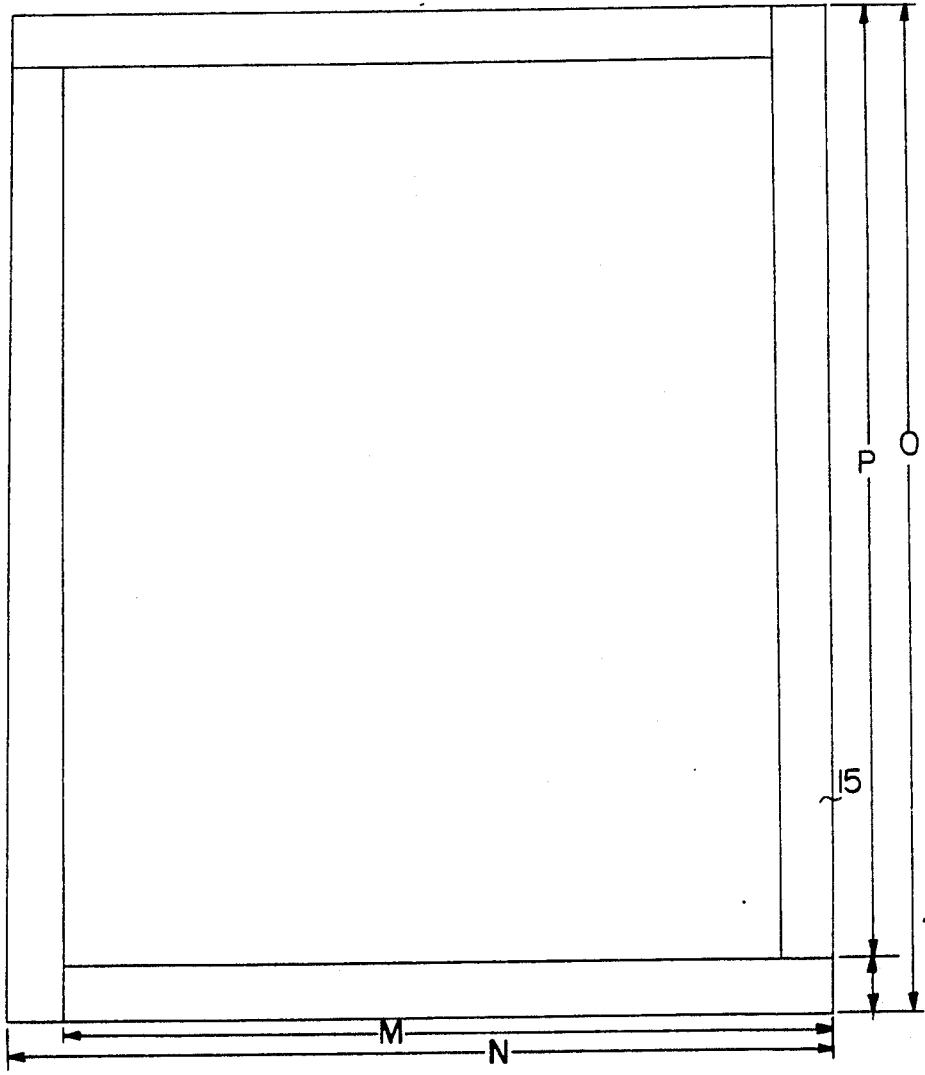
FIG.7

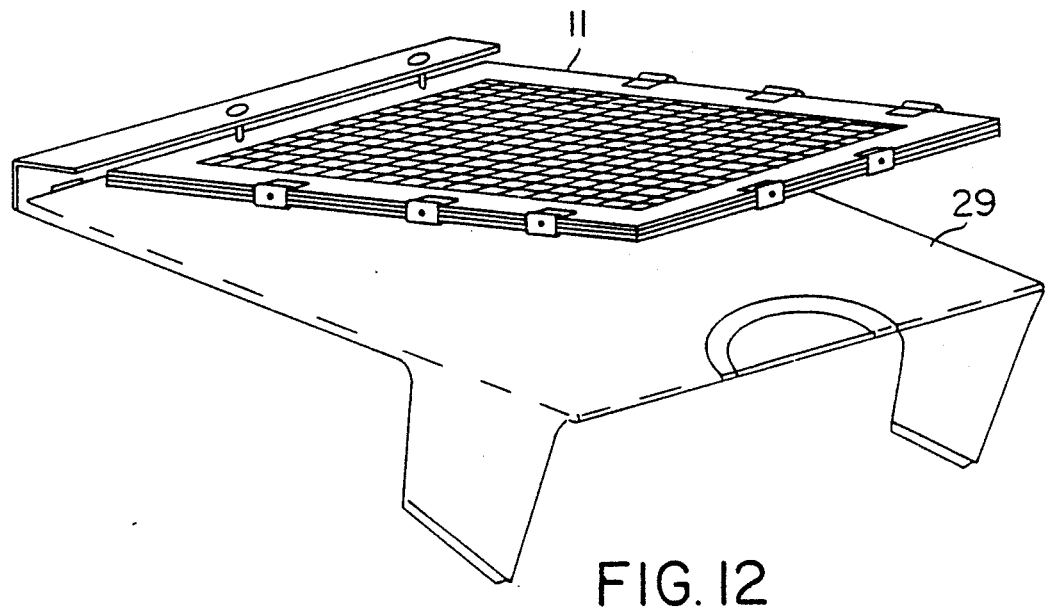
FIG. 12
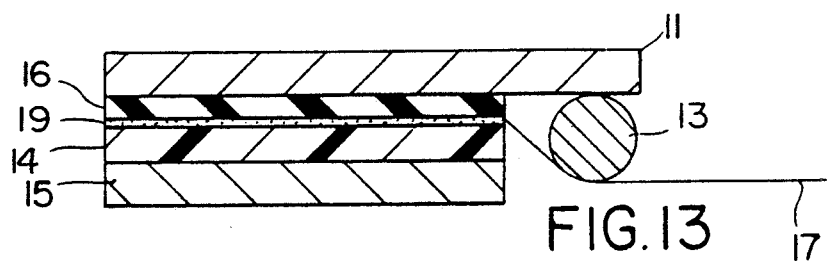
FIG. 13
FIG. 11
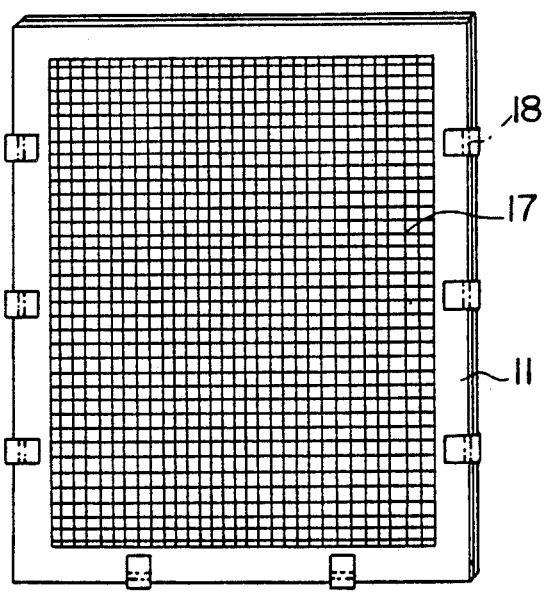

IMPARTING AN IMAGE ON A SUBSTRATE

BACKGROUND OF THE INVENTION

1. Field of the Invention

The present invention concerns a method to impart an image on a substrate. More particularly, the invention relates to a relatively quick method to impart an image onto a fabric without resort to cumbersome and time consuming screen traditional preparation methods, by utilizing a heat sensitive material.

2. Background Information

Heretofore the preferred method of applying an image to a substrate, for example, a fabric item, such as a T-shirt, jacket or cap, was to employ traditional screen printing. In traditional screen printing, a screen or mesh is very tightly placed on a frame. A light sensitive material (film or coating sensitive to light, for example, ultra-violet light) is placed on the screen. An image on paper or a film is placed on the light sensitive material and then exposed to light. Where the light is blocked out by the dark areas in the image, the corresponding area in the light sensitive material is soluble and can be washed off with water. Where light passes through transparent areas in the image, the corresponding area is insoluble and will not be washed away. The traditional screen printing process takes one to two days.

It would be advantageous to impart an image onto a fabric or the like in a few minutes, e.g., less than five minutes, as opposed to one or two days.

SUMMARY OF THE INVENTION

It is an object of the present invention to impart an image on a substrate.

It is a further object of the invention to relatively quickly screen print an image to a fabric, without the need for the traditional time consuming process of stretching, curing and developing a screen.

The above objects, as well as other objects, aims and advantages are satisfied by the present invention.

The present invention concerns a method to impart an image or a substrate. The method includes (a) placing a heat sensitive thermoplastic resin film supported on an ink pervious porous screen on a surface of a self-adhesive frame, (b) placing a sheet containing the desired image in a carbon base on the resultant assembly from (a) with the image side in close contact with the resin film surface of the resultant assembly from (a), (c) irradiating the resultant assembly formed in (b) with a high intensity light having a radiation intensity for wavelengths of 0.7 microns or more concentrated at 60% or more in terms of quantity of light within the wavelength range of from 0.7 to 1.2 microns, the radiation being effective for a time interval of $10^{-4}$ to $10^{-3}$ seconds, the radiation being absorbed by the image to generate absorptive heat thereat, wherein openings in the resin film are produced by the absorptive heat in corresponding portions of the resin film which are opposed to the image, (d) peeling the sheet off of the resultant assembly from (c), (e) stretching taut the resultant assembly from (d) in a sheet stretching holding frame, the holding frame comprising (1) a first planar frame having a first circumferential portion having a given first radial width, a given first axial depth, a first outer edge and a first inner edge, (2) a second planar frame having a second circumferential portion having a given second radial width, a given second axial depth, a second outer edge and a second inner edge, (3) a third planar frame having a third circumferential portion having a given third radial width, a given third axial depth, a third outer edge and a third inner edge, wherein the third inner edge extends radially inwardly of the first inner edge and the second inner edge, (4) a spongy gasket means disposed between said third planar frame and said first planar frame, (5) means for adhering a flexible sheet to one surface of the first planar frame, (6) a stretching member attached to one surface of the third planar frame, the stretching member adjacent to the third inner edge and disposed radially inwardly of the first and second inner edges, the stretching member extending along the circumference of the third planar frame, and (7) means for connecting the first, second and third frames together in a superposed relationship with the first frame disposed between the second frame and the third frame and the one surface of first frame facing the one surface of the third frame, the means for connecting comprising a plurality of spring clips or spring clamps wherein the stretching means has an axial depth such that when the three frames are connected together by the connecting means, the sheet is stretched and held taut, (f) placing the resultant assembly from (e) onto a screen printer means and (g) applying ink on the resultant assembly from (a) containing the openings produced in (c) to force the ink through the openings onto the substrate.

BRIEF DESCRIPTION OF THE DRAWINGS

For the purpose of illustrating the invention there is shown in the drawings forms which are presently preferred. It is to be understood, however, that the present invention is not limited to the precise arrangements and instrumentalities depicted in the drawings.

FIG. 4 is another side view of the upper frame depicted in FIG. 1.

FIG. 5 is a cross-sectional view of the upper frame, placement frame and lower frame of a screen stretching holder for use in the present invention.

FIG. 6 is a plan view depicting a lower frame of a screen stretching holding frame for use in the present invention.

FIG. 7 is a side view of the lower frame depicted in FIG. 1.

FIG. 11 is a perspective view of a screen stretching holding frame for use in the present invention.

FIG. 12 is a perspective view depicting the screen stretching holding frame depicted in FIG. 11 as attached to a conventional screen printing stand.

DETAILED DESCRIPTION OF THE INVENTION

Figure 1:
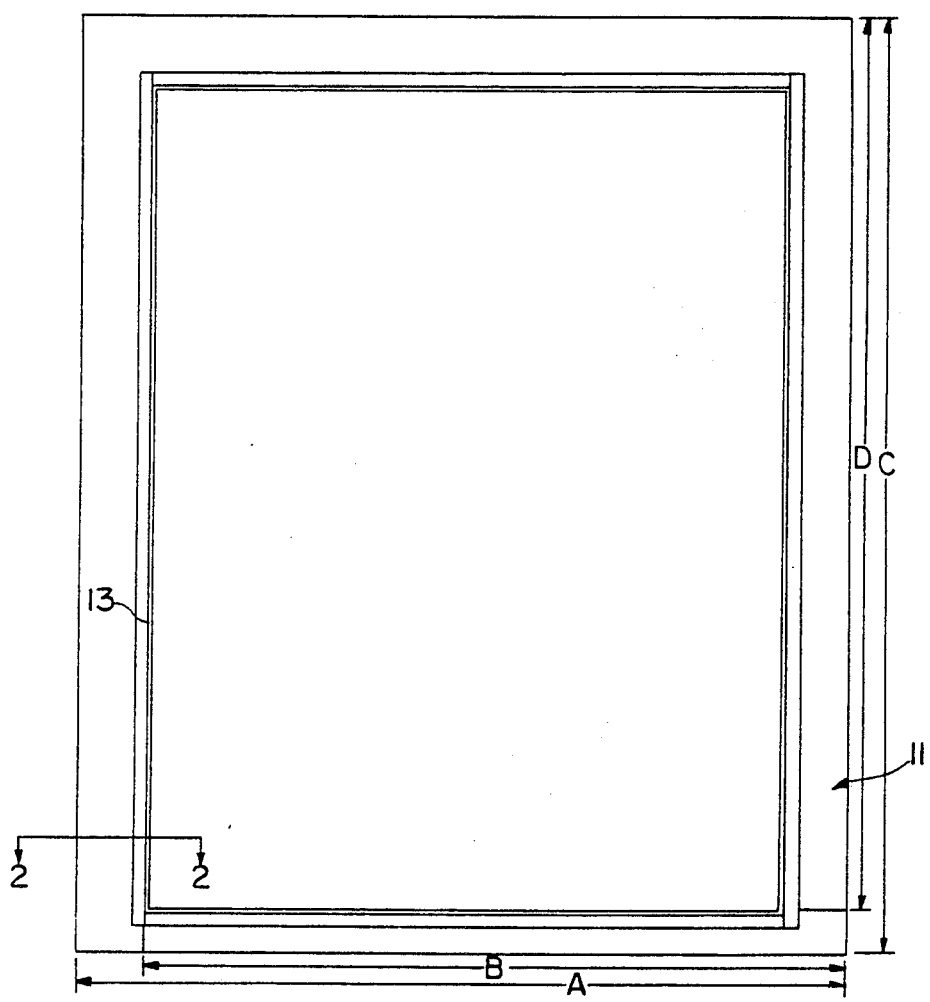
FIG. 1 is a plan view of an upper frame of a screen stretching holding frame for use in the present invention.

The heat sensitive thermoplastic resin film, ink pervious porous screen (substrate) and irradiation procedure for use in this invention are described in detail in U.S. Pat. No. 4,091,727, the entire contents of which are incorporated by reference herein.

The sheet for use in the present invention which contains the desired image in a carbon base can be a fabric, paper or plastic, just to name a few substrates, wherein the image therein is in a carbon base, for example, pencil, ink or paint. In particular embodiments, the image could be handwriting with pencil or ink or a piece of paper, a photocopy, or a photographic film, just to name a few.

The self-adhesive placement frame for use in the invention is typically a square or rectangular wooden frame having on one side thereof adhesive or double-sided adhesive tape to hold the heat sensitive thermoplastic resin film supported on an ink pervious porous surface in place.

A screen printing means for use in the present invention is a typical printing means used for screen printing, such as depicted and described in *The Encyclopedia of Garment Printing*, Scott & Pat Fresener, The Fresener Group, Inc., 1985.

A screen printing means is generally a manual press that holds a screen and substrate and provides a means for moving the screen up and down in the same location. This can be accomplished by a screen clamp using inexpensive screen hinges or as elaborate as a precisioned machine having cast aluminum clamps with a hair-line micro-registration system.

The ink can be applied by, for example, using a squeegee. In a multiple, e.g., four station, printer, different color inks can be applied.

The preferred ink for use to force through the openings in the assembly is a plastisol. However, water-based inks can also be utilized.

The substrate to have an image imparted thereon can be, for example, a fabric material, e.g., a tee-shirt, a jacket, a cap, towel, wood, a plastic, metal or paper.

A sheet stretching holding frame for use in the present invention is described in U.S. Pat. No. 4,981,075.

The screen stretching apparatus preferably comprises

A) a thin, lightweight, inexpensive, rectangular placement frame, that has adhesive applied to one side onto which the sheet, e.g., screen, etc. can be quickly set, which will cause the sheet, e.g., screen, to be held in a flat orientation, B) a lower flat, rectangular frame of the same or about the same dimensions as the placement frame, onto which the placement frame is placed, with the sheet material facing up, C) an upper, rectangular frame having a wider side surface such that when the upper frame is placed on top of the lower frame and placement frame and the outer edges aligned, the inner edge of the upper frame extends inside of the lower frame and placement frame onto the inner edge of the upper frame; on the bottom side of the upper frame is a "spongy" gasket, for example, rubber strips, (attached to all sides of the frame) which serve to hold the placement frame securely against the upper frame; the placement frame lies directly on these rubber strips which are cut to the dimensions of the upper frame; attached is a round (other shapes can also be used) rod or tube that pushes the screen down along all sides of the frame, extending the screen downward causing the screen material to be pulled tight in all directions, providing an ideal surface for screen printing; preferably the axial depth of the rod is greater than the axial depth of the gasket and D) a means of clamping the lower placement, and upper frames together which may involve the use of hinges along one side and various spring clamping devices along the other sides as needed to achieve the desired screen tightness.

It is preferred that all three frames have continuous circumferences. It is also preferred that the placement frame and the lower frame have congruent concentric inner edges.

Figure 2:
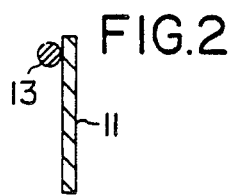
FIG. 2 is a sectional view taken along line I—I of FIG. 1.

Referring to the drawings, in all of which like parts are designated by like reference numbers, the upper frame 11 of a screen stretching holding frame for use in the present invention is depicted in FIG. 1 and FIG. 2. The upper frame 11 is preferably fabricated from metal, e.g., steel or aluminum, preferably ¼" thick aluminum, and round rods 13 which are welded to the inner circumference of upper frame 11. Although the corners of the upper frame 11 are squared, such corners could be rounded off.

Figure 3:
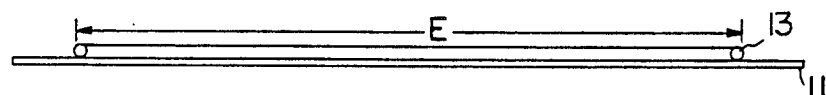
FIG. 3 is a side view of the upper frame depicted in FIG. 1.

Preferred dimensions for the upper frame 11 as depicted in FIGS. 1, 3 and 4 are as follows:

| | |
|---|---|
| A | 15¼ inches |
| B | 13⅞ inches |
| C | 18¼ inches |
| D | 16⅞ inches |
| E | 12¾ inches |
| F | 15¾ inches. |

FIG. 5 depicts, in cross-section, the upper frame 1 and rod 13 (preferably rod 13 is a ¼ inch diameter aluminum rod), the placement frame 14 and the lower frame 15 of a screen stretching holder frame according to the present invention. A "spongy" gasket 16 (preferably fabricated from 1/16 inch neoprene rubber) is disposed between upper frame 11 and screen frame (placement frame) 14. A silk screen 17 is disposed between gasket 16 and screen frame 14. The screen frame 14 is preferably thin, lightweight and inexpensive and is preferably made from 3 mm or ⅛ inch plywood or plastic. Adhesive 19 is applied to the side of the screen frame 14 which faces the silk screen 17.

Preferred dimensions as depicted in FIG. 5 are as follows:

| | |
|---|---|
| G | 1¼ inches |
| H | 1 inch |
| J | 7/16 inch |
| K | 1½ inches |
| L | ⅛ inch. |

FIG. 6 depicts lower frame 15, which is preferably fabricated from metal, e.g., aluminum or steel, preferably ⅛ inch thick aluminum.

Preferred dimensions for the lower frame as depicted in FIG. 6 are as follows:

| | |
|---|---|
| M | 14.125 inches |
| N | 15.125 inches |
| O | 18.125 inches |
| P | 17.125 inches. |

Figure 8:
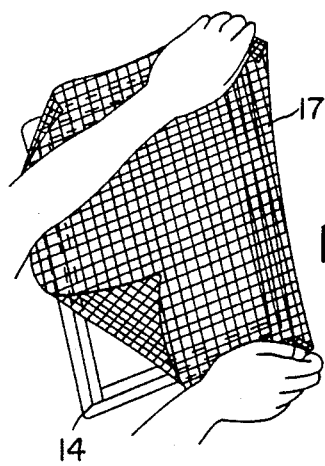
FIG. 8 is a perspective view depicting a screen material being applied to a placement frame of a screen stretching holding frame for use in the present invention.

In FIG. 8 there is depicted the attachment of screen material 17 to placement frame 14. The side of placement frame 14 facing the screen material 17 is lined with adhesive, either from double stick tape or from glue. After the screen material 17 is adhered to frame 14, excess screen material is trimmed away from the edges using a scissor or a knife.

Figure 9:
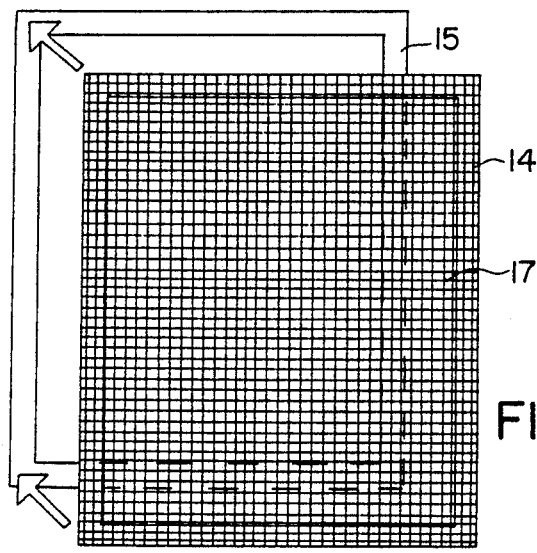
FIG. 9 is an elevational view depicting the placement frame being placed over the lower frame of a screen stretching holding frame for use in the present invention.

In FIG. 9, there is depicted the placement of frame screen 14 (such as that obtained from the procedure depicted in FIG. 5) on the lower frame 15, such that the side of the frame 14 not covered by screen material 17 lies directly on lower frame 15.

After the positioning as depicted in FIG. 9 is completed, there results a "stretched" frame, i.e., the screen material 17 is stretched.

Figure 10:
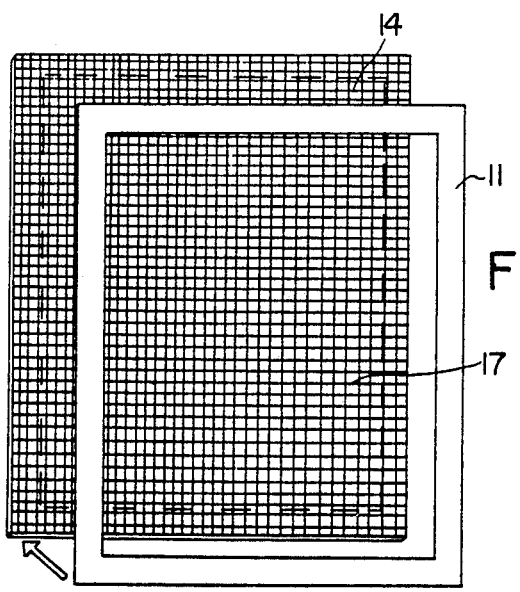
FIG. 10 is an elevational view depicting the upper frame being positioned against the placement frame and the lower frame of a screen stretching holding frame for use in the present invention.

FIG. 10 depicts the closing of the "stretching" apparatus by placing the upper frame 11 directly on the "stretched" frame such as that obtained from FIG. 9. The flat "metal" side of upper frame 11 should face up, while the side with the gasket 16 faces down. After the positioning as depicted in FIG. 10 is completed, the "stretched" frame is "sandwiched" between the upper frame 11 and lower frame 15.

FIG. 11 depicts a screen stretching holding frame according to the present invention having spring clips 18 which hold all the frames 11, 14 and 15 together.

The spring clips or spring clamps 18 are placed on all sides of the device, except for the top (during printing the top of the device can be secured).

FIG. 12 shows a screen stretching holding frame according to the invention attached to a conventional screen printing stand 29. A tee-shirt 30 that will be printed on is displaced on printing stand 29. The device as depicted in FIG. 12 is ready for printing.

A conventional screen printing screen is made of a nylon or polyester woven fabric. Using certain convention screen holding devices, the polyester or nylon fabric will stretch if held under pressure for an extended time. This causes a major problem with certain conventional screen stretching/holding frames because it is almost impossible to re-tighten. The screen stretching/holding system used in the present invention offers a major advantage over the conventional systems because the screen is held tight only while it is being used. During storage it remains attached to the holding/orientating frame in a relaxed position.

Further, the screen stretching/holding system used in the present invention has another advantage in that in a preferred embodiment of the invention as discussed in detail hereinbelow, the exact tightness of the screen is determined by the amount of spring tension applied by spring holding clips. In the present invention, the three screen frames normally do not come into tight contact unless the screen is very loosely attached to the orienting frame, thereby allowing a self-regulating method of maintaining the same screen tension even after extended use, whereby the screen (nylon or polyester) has started to stretch.

In a preferred embodiment, spring tension clamps or clips are utilized on three sides of the inventive device. Such spring tension clamps are preferably made of spring steel or other material which would impart a spring tension. Alternatively, a spring can be utilized. The purpose of the spring tension clamps are to allow a self-regulating mechanism to maintain a constant tension across the surface of the sheet material even after extended use or storage, which would otherwise sag, thereby allowing the user to produce more uniform prints when the apparatus is used for screen printing.

It is further preferred to employ the aforesaid spring clamps in conjunction with a "spongy" gasket, which gasket is disposed between the placement frame and the upper frame.

It will be appreciated that the instant specification is set forth by way of illustration and not limitation, and that various modifications and changes may be made without departing from the spirit and scope of the present invention.

What is claimed is:

1. A method to impart an image on a substrate comprising
   (a) placing a heat sensitive thermoplastic resin film supported on an ink pervious porous screen on a surface of a self-adhesive frame,
   (b) placing a sheet containing the desired image in a carbon base on the resultant assembly from (a) with the image side in close contact with the resin film surface of the resultant assembly from (a),
   (c) irradiating the resultant assembly formed in (b) with a high intensity light having a radiation intensity for wavelengths of 0.7 microns or more concentrated at 60% or more in terms of quantity of light within the wavelength range of from 0.7 to 1.2 microns, said radiation being effective for a time interval of $10^{-4}$ to $10^{-3}$ seconds, said radiation being absorbed by the image to generate absorptive heat thereat, wherein openings in the resin film are produced by said absorptive heat in corresponding portions of said resin film which are opposed to said image,
   (d) peeling the sheet off of the resultant assembly from (c),
   (e) stretching taut the resultant assembly from (d) by placing the resultant assembly from (d) in a sheet stretching holding frame, said holding frame comprising
      (1) a first planar frame having a first circumferential portion having a given first width, a given first axial depth, a first outer edge and a first inner edge,
      (2) a second planar frame having a second circumferential portion having a given second width, a given second axial depth, a second outer edge and a second inner edge,
      (3) a third planar frame having a third circumferential portion having a given third radial width, a given third axial depth, a third outer edge and a third inner edge, wherein the third inner edge extends radially inwardly of the first inner edge and the second inner edge,
      (4) a spongy gasket means disposed between said third planar frame and said first planar frame,
      (5) means for adhering a flexible sheet to one surface of the first planar frame, (6) a stretching member attached to one surface of the third planar frame, the stretching member adjacent to the third inner edge and disposed radially inwardly of the first and second inner edges, the stretching member extending along the circumference of the third planar frame, and (7) means for connecting the first, second and third frames together in a superposed relationship with the first frame disposed between the second frame and the third frame and the one surface of first frame facing the one surface of the third frame, said means for connecting comprising a plurality of spring clips or spring clamps, wherein the stretching means has an axial depth such that when the three frames are connected together by the connecting means, the sheet is stretched and held taut, (f) placing the resultant assembly from (e) onto a screen printer means and (g) applying ink on the resultant assembly from (a) containing the openings produced in (c) to force the ink through the openings onto the substrate.

2. A method according to claim 1, wherein the substrate is a fabric.

3. A method according to claim 1, wherein the first planar frame, the second planar frame and the third planar frame are all rectangular.

4. A method according to claim 1, wherein the means for adhering the spongy material is adhesive.

5. A method according to claim 1, wherein the axial depth of the stretching member is greater than the axial depth of the spongy gasket means.

6. A method according to claim 1, wherein said first planar frame and said second planar frame have congruent concentric inner edges.

7. A method according to claim 1, wherein the stretching means is a tube.

8. A method according to claim 1, wherein the stretching means is a rod.

9. A method according to claim 1, wherein the first, second and third planar frames have continuous circumferences.

* * * * *